United States Patent [19]

Pryor et al.

[11] 4,419,177

[45] Dec. 6, 1983

[54] PROCESS FOR ELECTROMAGNETICALLY CASTING OR REFORMING STRIP MATERIALS

[75] Inventors: Michael J. Pryor, Woodbridge; Derek E. Tyler, Cheshire; John C. Yarwood, Madison, all of Conn.

[73] Assignee: Olin Corporation, New Haven, Conn.

[21] Appl. No.: 191,630

[22] Filed: Sep. 29, 1980

[51] Int. Cl.³ .................. B22D 11/16; B22D 27/02
[52] U.S. Cl. .................................. 156/601; 164/469; 164/503; 164/504; 164/507; 164/493; 264/22; 264/27; 264/40.6; 156/608
[58] Field of Search ............... 164/467, 492, 493, 498, 164/499, 502, 503, 507, 504; 264/22, 27, 165, 555, 332, 40.6; 425/174.8 R; 156/601, 608

[56] References Cited

U.S. PATENT DOCUMENTS

| | | | |
|---|---|---|---|
| 2,897,329 | 7/1959 | Matare | 219/10.43 |
| 3,296,036 | 1/1967 | Keller | 148/1.6 |
| 3,463,365 | 8/1969 | Dumont-Fillon | 222/594 |
| 3,467,166 | 9/1969 | Getselev et al. | 164/467 |
| 3,936,346 | 2/1976 | Lloyd | 156/620 |
| 3,985,179 | 10/1976 | Goodrich et al. | 164/467 |
| 4,004,631 | 1/1977 | Goodrich et al. | 164/503 |
| 4,161,206 | 7/1979 | Yarwood et al. | 164/467 |
| 4,213,496 | 7/1980 | Yarwood et al. | 164/503 |
| 4,215,738 | 8/1980 | Gaule | 164/467 |
| 4,242,553 | 12/1980 | Berkman et al. | 219/10.49 R |

FOREIGN PATENT DOCUMENTS 1277869 10/1961 France .
2480154 10/1981 France .
1481301 7/1977 United Kingdom .
1499809 2/1978 United Kingdom .
2009002 6/1979 United Kingdom .
2009003 6/1979 United Kingdom .
2041803 9/1980 United Kingdom .

OTHER PUBLICATIONS

"An Introduction to Semiconductors", by Dunlap, Jr., published in 1957, by John Wiley & Sons, Inc., London–Chapter 10, pp. 206–223.
"Zone Melting", by Pfann, published in 1958, by John Wiley & Sons, pp. 74–81 & 89–97.
*National Technical Information Service Report* PB–248963 "Scale Up of Program on Continuous Silicon Solar Cells" by A. D. Morrison, published in Sep., 1975.
"The Role of Surface Tension in Pulling Single Crystals of Controlled Dimensions" by G. K. Gaule et al. from *Metallurgy of Elemental and Compound Semiconductors*, published by Interscience Publishers, Inc., NY in 1961, pp. 201–226.

*Primary Examiner*—Gus Hampilos
*Attorney, Agent, or Firm*—Paul Weinstein; Howard M. Cohn; Barry L. Kelmachter

[57] ABSTRACT

A process for electromagnetically containing and forming molten material into a desired thin strip shape. At least two inductors are employed which are powered at respectively different frequencies. The frequency of the current applied to the upstream inductor is substantially lower than the frequency applied to the downstream inductor thereby providing improved efficiency and reduced power consumption.

11 Claims, 4 Drawing Figures

PROCESS FOR ELECTROMAGNETICALLY CASTING OR REFORMING STRIP MATERIALS

This invention relates to an improved process for electromagnetically containing and forming a thin strip material. The process is particularly applicable to electronic semiconductor type materials including specifically silicon. The process of this invention can be adapted to form polycrystalline or single crystal thin strip material.

The electromagnetic casting process has been known and used for many years for continuously and semi-continuously casting metals and alloys. The process has been employed commercially for casting aluminum and aluminum alloys. The process in its known application has been used for casting relatively thick castings.

The electromagnetic casting apparatus comprises a three part mold consisting of water cooled inductor, a non-magnetic screen and a manifold for applying cooling water to the casting. Such an apparatus is exemplified in U.S. Pat. No. 3,467,166 to Getselev et al. Containment of the molten metal is achieved without direct contact between the molten metal and any component of the mold. Solidification of the molten metal is achieved by the direct application of water from a cooling manifold to the solidifying shell of the casting.

An elaborate discussion of the prior art relating to electromagnetic casting is found in U.S. Pat. Nos. 4,161,206 and 4,213,496 to Yarwood et al. That prior art statement is intended to be incorporated by reference herein. The Yarwood et al. patents themselves deal with a control system for controlling the electromagnetic process.

U.S. Pat. Nos. 3,985,179 and 4,004,631 to Goodrich et al. show the use of shaped inductors in electromagnetic casting. The U.S. Pat. No. 3,985,179 also discloses the use of an inductor comprising an upper and a lower inductor insulated from one another. The upper inductor carries less current than the lower inductor.

U.K patent application Nos. 2,009,002 and 2,009,003 are further illustrative of shaped inductors for electromagnetic casting.

U.S. patent application Ser. No. 9,429 to Gaule et al., filed Feb. 5, 1979, discloses the use of a multiturn inductor in electromagnetic casting wherein the pitch or spacing of individual turns is controlled to provide a desired electromagnetic pressure variation.

In U.S. patent application Ser. No. 139,617, filed Apr. 11, 1980, by Michael J. Pryor, there is disclosed an electromagnetic thin strip casting apparatus and process. Molten material which could be a semiconductor, semi-metal or metal is formed into thin strip shape by a shaped inductor having a first portion for shaping the molten material into the desired thin strip shape and a second portion upstream thereof for electromagnetically containing the molten material in a sump. The sump at a top surface thereof has a substantially larger cross-sectional area as compared to th cross-sectional area of the thin strip shape being cast. Pryor proposes using upper and lower inductors insulated from one another to provide the first and second portions. The upper and lower inductors can be independently powered to provide different currents. Further, the frequency of the upper inductor can be increased in order to provide sufficient heat input to the casting system in order to melt a solid bar of the material for purposes of replenishing the sump.

In U.S. patent application Ser. No. 158,040, filed June 9, 1980, to Joseph Winter, there is disclosed an apparatus for passing a floating molten zone through a starting strip of material in order to form a resulting strip of material having improved thickness uniformity and/or a thinner cross section and/or improved purity. An inductor is employed for containing and shaping the floating molten zone.

U.S. Pat. No. 3,463,365 to Dumont-Fillon and British Pat. No. 1,481,301 are exemplary of the art relating to the use of electromagnetic fields for controlling metal flow from a tundish or crucible into the mold. In the British patent an electromagnetic field is not only used to control the flow of molten metal from the crucible but also to keep the molten metal from flowing against the refractory of a portion of the crucible to thereby reduce erosion of the refractory. In the British patent the crucible is relatively large in diameter as compared to the opening or nozzle through which the molten metal exits the crucible and is supplied to the mold.

In British Pat. No. 1,499,809 a rod casting system is provided utilizing a crucible and electromagnetic flow control arrangement similar to that described in the previous '301 British patent. However, in this case the electromagnetic coil which controls metal flow also serves to shape the metal into the desired rod shape which is then cooled with water to solidify it and rolled into a final desired rod or wire product. Various techniques are known in the art for forming single crystals of semi-conductor materials such as those described in "An Introduction To Semiconductors", by Dunlap, Jr., published in 1957, by John Wiley & Sons, Inc., London. Chapter 10 of the book at Pages 206 through 223 describes various methods for preparing semiconductor materials. A floating zone technique for zone refining is described in the book "Zone Melting", by Pfann, published in 1958, by John Wiley & Sons, Inc. The use of inductive heating is described at Pages 74 to 81. The use of a floating zone technique is described at Pages 89 through 97.

Other disclosures of processes which have been developed for forming semiconductive materials such as silicon into thin strip shapes are exemplified by the approaches described in National Technical Information Service Report PB-248963 "Scale Up of Program on Continuous Silicon Solar Cells" by A. D. Morrison, published in September, 1975, and a paper entitled "The Role of Surface Tension in Pulling Single Crystals of Controlled Dimensions" by G. K. Gaule et al. from Metallurgy of Elemental and Compound Semiconductors, published by Interscience Publishers Inc., New York in 1961, Pages 201–226. The Morrison publication is exemplary of the state of the art with respect to the pulling of strip type materials from a melt of silicon. The Gaule et al. publication is similarly exemplary and of particular interest insofar as it discloses the use of electromagnetic forces for applying external pressure at the growth interface.

In accordance with the present invention a process and apparatus are provided for inductively heating and containing molten material for forming said molten material into a desired thin strip shape. The process and apparatus can relate to a casting apparatus wherein the molten material is cast into the desired thin strip shape or alternatively to a strip reforming apparatus wherein a floating zone of molten material is passed through a starting strip to reform it into an improved thin strip shape. Preferably, both of the aforenoted apparatuses utilize at least two inductors and, preferably, at least three inductors which can be individually powered from a single or from multiple sources.

In accordance with this invention the efficiency of the processes and apparatus is markedly improved by controlling the frequency of the currents applied to the respective inductors in a manner so that the final inductor which provides shaping of the molten material into the thin strip form is powered at a much higher frequency than the inductor which is utilized for containing the molten material prior to the shaping operation.

Accordingly, it is an aspect of this invention to provide an improved process and apparatus for electromagnetically containing and forming molten material into a desired thin strip shape.

It is a further aspect of this invention to provide a process and apparatus as above employing plural inductors whose frequencies are controlled to provide lower power consumption.

It is yet a further aspect of this invention to provide a process and apparatus as above wherein the frequencies are further selected to enhance electromagnetic mixing of the molten material.

These and other aspects will become more apparent from the following description and drawings.

Figure 1:
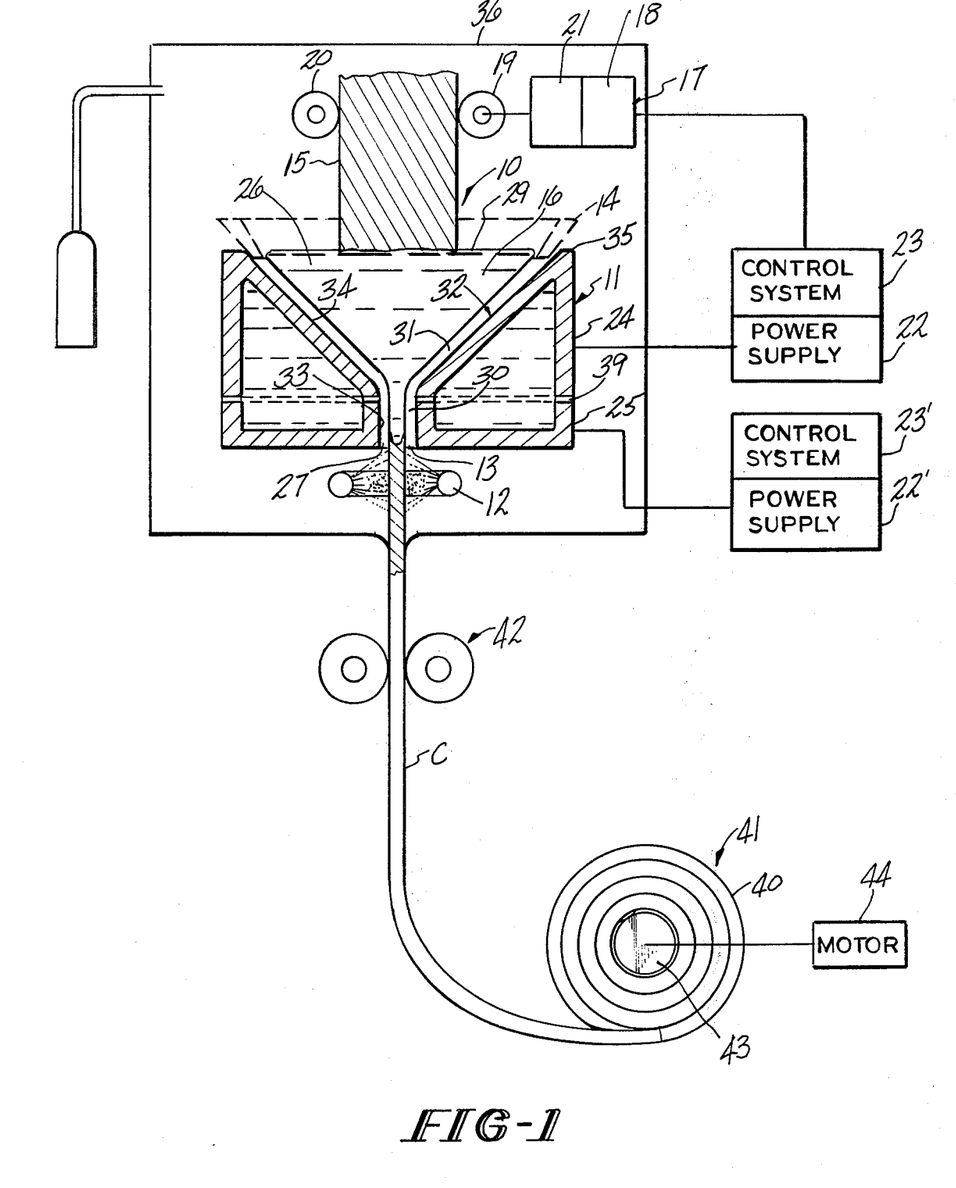
FIG. 1 is a schematic representation of a casting apparatus in accordance with one embodiment of this invention.

Referring now to FIG. 1 there is shown by way of example an electromagnetic casting apparatus of this invention. The electromagnetic casting mold 10 is comprised of an inductor 11 which is water cooled; a cooling manifold 12 for applying a suitable coolant to the peripheral surface 13 of the material being cast C and optionally a non-magnetic screen 14 shown in phantom. In accordance with this embodiment molten material such as silicon is replenished by continuously introducing a solid rod 15 of silicon into the sump 16 of molten material during a casting run using molten metal head control 17. The head control 17 can comprise an ordinary motor controller 18 which can be manually operated or preferably automatically controlled in the manner described in U.S. patent application Ser. No. 110,893, filed Jan. 10, 1980, by Ungarean et al. In accordance with the preferred approach the rod 15 of silicon or other material is arranged for movement axially of the casting C by means of pinch rolls 19 and 20 actuated by a suitable stepping or serving motor 21 which in turn is actuated from the power supply 22 and control system 23. Movement of the silicon rod into the molten material is controlled in accordance with long term increases or decreases in the inductance of the inductor 11. Further details of this approach can be found by reference to the Ungarean et al. application.

The inductor 11 comprises at least two electrically isolated inductors 24 and 25 which are excited by an alternating current from a power source 22 or 22' and control system 23 or 23'. The power source 22 or 22' and control system 23 or 23' may be of any desired design, however, preferably they are in accordance with the teachings of U.S. Pat. No. 4,161,206 to Yarwood et al. In that approach the current in the inductor 11 is controlled in a manner so as to maintain the inductance of the inductor 11 substantially constant. This insures a uniform air gap being maintained between the molten material and the opposing inductor 11 as a casting run proceeds.

The alternating current in the inductor 11 produces a magnetic field which interacts with the molten material head 26 to produce eddy currents therein. These eddy currents in turn interact with the magnetic field and produce forces which apply a magnetic pressure to the molten material head 26 to contain it so that it solidifies in a desired thin strip cross section. An air gap 27 exists during casting between the molten material 26 and the inductor 11. The molten material head 26 is formed or molded in the solidification zone 28 into the same general shape as the inductor 11 thereby providing the desired thin strip cross section. The inductor 11 preferably has a rectangular shape surrounding the molten material in order to obtain the desired thin strip cross section.

The purpose of the optional non-magnetic screen 14 if used is to fine tune and balance the magnetic pressure with the hydrostatic pressure of the molten material head 26 near the upper surface 29 of the molten material head 26. The non-magnetic screen 14 may comprise a separate element as shown or it may be integrated into other structural elements of the apparatus such as the inductor as in the patents to Goodrich et al. The unique shape of the inductor 11 of this invention should in most cases eliminate the need for a shield 14.

Solidification of the molten material which is magnetically contained in the mold 10 is achieved by direct application of coolant from the cooling manifold 12 to the solidifying casting C surface 13. In the embodiment which is shown in FIG. 1 water or inert gas is applied to the casting surface 13 just below the inductor and in very close proximity therewith. Alternatively, if desired, the coolant may be applied to the casting surface 13 within the inductor by providing suitable coolant ejection slots or ports in the inductor 11 itself.

In the apparatus shown in FIG. 1 the molten material sump 26 has a non-uniform cross section. In a first portion 30 of the containment zone wherein solidification takes place the molten material is formed into the desired cross-sectional shape for the resulting thin strip casting. At a second portion 31 of the containment zone upstream of the first portion, the molten material sump 26 flares out so as to create at its upper surface 29 a cross-sectional area which is preferably at least about five times greater than the cross-sectional area of the strip C being cast and most preferably at least seven times greater.

The second portion 31 of the containment zone creates a molten material sump which is substantially wider than the strip C being cast. The volume of the molten material sump 26 is sufficiently great to insure that the molten material head height which controls the hydrostatic pressure of the molten material within the solidification portion 30 of the containment zone is maintained substantially constant. This reduces fluctuations in the hydrostatic pressure and provides a resultant strip C product of higher cross-sectional and thickness uniformity.

In the preferred embodiment shown in FIG. 1 the electromagnetic containment zone providing the two portions as described above is achieved by means of a unique inductor 11 design. The surface 32 of the inductor facing the molten material is divided into two corresponding portions 33 and 34. The first portion 33 has a general shape corresponding to the desired shape of the thin strip casting C. The second portion 34 is flared outwardly from the first portion to provide at the top 35 of the inductor 11 an air space defining the containment zone having a first cross-sectional area which is substantially greater than the second cross-sectional area of the air space defining the containment zone of the first portion. Preferably, the first cross-sectional area is greater than about five times as large as the second cross-sectional area and most preferably at least seven times greater. The angle of inclination of the surface 34 is preferably selected so that for the material being cast there is a general balance between the current magnitude in the inductor and the hydrostatic pressure exerted by the molten material at each point in the portion 31 of the containment zone. For example, the molten material head height and, therefore, the hydrostatic pressure exerted by the molten material at each point of the portion 34 of the inductor 11 can generally be increased by making the surface 34 more vertically oriented and vice versa.

In the embodiment which is shown a non-magnetic screen 14 or shield has been shown in phantom which optionally could intercept a portion of the field from the inductor 11 near the top surface 29 to prevent undue rounding off of the top corners of the molten material sump 26. In practice, however, it should be possible due to the particlar shape of this inductor 11 to eliminate the need for the shield 14 which, therefore, is not believed to be an essential element in this apparatus. This is the case since the current density at the top 35 of the inductor 11 will be at its lowest due to the large current path.

The apparatus as aforenoted has application in the casting of ultra thin strip from materials such as metals, alloys and metalloids including semiconductor materials such as silicon, germanium, etc. The apparatus shown in FIG. 1 is adapted to provide ultra thin strip casting C which are optionally of a single crystal nature. The entire mold 10 is supported within a chamber 36 which provides an inert gas atmosphere such as argon so as to maintain the purity of the material being cast. The silicon or other material is added from a solid bar 15.

The inductor 11 has been divided into two sections 24 and 25. The upper section 24 includes the surface 34. The lower section of the inductor 25 includes the surface 33. An insulating gasket 39 is employed between the upper and lower sections 24 and 25. The insulating gasket 39 serves to electrically insulate the upper section 24 from the lower section 25. The two sections 24 and 25 are secured together in a water tight manner by means of insulating screws (not shown). The purpose of insulating the upper section 24 from the lower section 25 is to provide independent powering of the upper section relatively to the lower section in order to tailor the current levels and frequencies in the respective surfaces 33 and 34 of the inductor 11. This will aid in providing the desired strip forming action in the portion 30 of the inductor 11 and the desired molten material sump supporting action in the portion 31.

In order to tailor the power and frequency applied to each section 24 and 25 of the inductor 11 it is preferable to employ two power supplies 22 and 22' and two control systems 23 and 23', respectively. In this manner the current and/or frequency applied to the upper section 24 of the inductor 11 may be totally different than the current and/or frequency applied to the lower section 25 resulting in corresponding differences in the magnetic field strengths and power consumptions of the respective sections 24 and 25. Depending on the material being cast it should be possible to better balance the desired magnetic force provided by the inductor 11 and the hydrostatic pressures exerted by the material being cast and also to provide reduced power consumption.

In the embodiment shown in FIG. 1 the system is set up preferably for casting semi-conductor materials such as silicon as a single crystal. In this instance the silicon is required to have a very high purity and retain that high purity in the final cast product. Therefore, the casting is carried out in an inert atmosphere as above described. It is further desired that the material being cast not contact any other material such as a crucible in order to avoid contamination. The power supplies 22 and 22' and control systems 23 and 23' operate in the same manner except that the respective current levels and frequencies in the upper section 24 and lower section 25 of the inductor 11 may be varied as described above. While the apparatus of FIG. 1 is particularly adapted for forming ultra thin strip having a single crystal morphology it can be utilized for casting other materials and thicknesses.

In the embodiment of FIG. 1 the molten material sump 26 is replenished by melting the end of a solid bar 15 of the material being cast. To accomplish this melting it is proposed in accordance with a preferred aspect of this invention that the inductor 11 be powered in a manner so as to not only contain and support the molten material sump 26 but so as to also heat the material in the sump 26 to a temperature at which it will melt the solid addition bar 15 as it is advanced into the sump 26. This is accomplished by balancing the pressure and heat input provided by the inductor 11. In order to provide melting the frequency of the applied current is selected to increase the heating effect of the applied field and the effective resistance of the melt. Obviously, the ability to use the inductor 11 for both heating and containment will be to a large degree affected by the resistivity of the material being cast. In the case of semi-conductive type materials such as silicon or germanium their high resistivity will serve to improve the heating effect of the inductor. It may not be possible to use the inductor for both containment and heating when comparatively low resistivity materials are employed. However, generally speaking it is usually desired to form ultra thin strip castings from such high resistivity materials which find application in semi-conductor and electronic devices.

The movement of the solid addition bar 15 of silicon into the molten material sump 26 is controlled by the control system 23 and power supply 22 of the inductor 11 so that the upper surface 29 of the molten material is maintained at a substantially constant position in order to reduce changes in the hydrostatic pressure exerted by the molten material in the solidification zone 28. This may be accomplished by utilizing feed rollers 19 and 20 connected to a motor 21 which in turn is powered from the control system 18. In this embodiment the control system controls the replenishment of the molten material sump 26 by preferably maintaining a constant inductance on the inductor 11. If the height of the molten material 26 increases or decreases, there is a change in the hydrostatic pressure applied by the molten material. This in turn will cause the molten material sump to either reduce the air gap 27 between it and the inductor or increase it, respectively. In either case the inductance of the inductor will be correspondingly changed. In accordance with the Yarwood et al. patents as described in the background of this application the inductance may be kept constant by means of the power applied to the inductor and in accordance with the Ungarean et al. application described in this application the inductance of the inductor can also be maintained within a desired limit by means of controlling the replenishment of the sump. Both of these approaches are preferably applied in accordance with the present invention in order to control the casting system to provide a resultant thin strip casting C of uniform cross section.

The action of the molten material and the power applied by the inductor 11 is sufficient to slowly melt the bar 15 of silicon as a replenishment for the silicon material withdrawn from the casting zone 28 as a solidified ultra thin strip C. While it is preferred in accordance with this embodiment that the inductor provide the energy for both supporting the molten material sump 26 and for melting the replenishment material 15 it is possible in accordance with this invention to melt the replenishment material at a remote location and convey it in molten form to the sump. In such an instance it would not be necessary for the inductor 11 to serve the dual purposes of heating for melting the replenishment material and for containment.

In casting silicon or other desired material in thin strip single crystal form it is desirable that the casting rate be very slow in accordance with known single crystal growing techniques. Therefore, the drop rate of the solid silicon material 15 being melted would be correspondingly slow. Further, to avoid contamination and in view of the slow withdrawal rates, instead of cooling the silicon strip C by means of the application of water an inert gas preferably could be applied from manifold 12. The single crystal morphology is obtained by using a single crystal seed 40.

It is desirable when casting ultra thin strips C that the power supply provide a current to the inductor 11 which is at a frequency which is selected such that the penetration depth of the current induced in the molten material is less than about ¼ of the thickness t of the strip being cast and preferably less than 1/6 thereof. The penetration depth is given by the following formula:

$$\delta = \sqrt{\frac{r}{\mu_o \pi f}}$$

In the above formula $\delta$ = the penetration depth. $\delta$ comprises the depth in the material in question at which the current is reduced by about 67% as compared to the current at the outer peripheral surface 13. $r$ = the resistivity of the material being cast. $\mu_o$ = the permeability of the material being cast. $f$ = the frequency of the applied current. $\pi$ = 3.14.

Penetration depth "$\delta$" in accordance with the present invention is defined by the above formula. In accordance with that formula it will be apparent that as the frequency of the applied current is increased the penetration depth decreases.

If it were desired to carry out the casting process without the formation of a single crystal structure, then the seed crystal 40 would be eliminated and any desired starter strip could be initially positioned within the containment field. For the casting of single crystal structures, however, the seed crystal 40 is positioned initially in the containment field and then slowly withdrawn at a rate consistent with obtaining the desired single crystal morphology. If a non-single crystal structure is acceptable, then it may be possible to employ water cooling in place of the gas cooling, if desired. However, gas cooling is preferred when casting a single crystal structure.

The strip withdrawal mechanism 41 comprises a thin strip starter block 40 which is positioned initially between feed rolls 42 so that the end of the starter block strip 40 is located within the containment zone 28. The feed rolls 42 control the rate at which the starter block strip 40 and the casting C are withdrawn from the containment zone 28. The feed rolls 42 control the rate at which the starter block strip 40 and the casting C are withdrawn from the containment zone 28. After the strip leaves the feed rolls 42 it is coiled up upon a drum 43 driven by motor 44. in this manner it is possible to cast extremely long lengths of the strip type material C.

In accordance with this invention the process and apparatus as described above with reference to FIG. 1 is improved by reducing the power consumption required for carrying it out. This is accomplished by controlling the frequency of the applied currents for the inductors 24 and 25 so as to reduce power consumption. The upper inductor 24 which supports the sump 26 of molten material is operated at a substantially lower frequency than the lower shaping inductor 25. The inductors 24 and 25 may be powered independently from two different power sources 22 and 22' as described above or alternatively the two inductors could be powered from a single power source 22 utilizing a state of the art step-down conversion technique to achieve the lower frequency in the upper inductor 24.

It has been found in accordance with this invention that it is necessary to utilize very high frequencies for the shaping inductor 25. This is necessary to eliminate the possibility of current losses due to excessive penetration of the current in the thin molten zone and further to eliminate adverse interactions between the magnetic field on opposite sides of the thin strip. In accordance with this invention the frequency of the lower inductor 25 is preferably controlled so that the penetration depth of the current in the strip is less than about ¼ of the thickness of the strip and, preferably, less than about 1/6 of the thickness of the strip. For very thin strips of material less than about 0.100" thick and, preferably, less than about 0.050" thick, the preferred frequency range for the lower shaping inductor 25 is generally in the megahertz range. The upper inductor 24, however, may be operated at a substantially lower frequency of from about 1 kilohertz to about 500 kilohertz and, preferably, from about 2 kilohertz to 10,000 kilohertz.

It is possible to power the upper inductor 24 at a lower frequency because the relative thickness of the molten pool 26 is substantially greater than for the thin strip shaped portion 28 adjacent the lower inductor 25. Therefore, the current frequency can be selected to provide a substantially greater penetration depth in the sump 26 of molten material without loss of current due to excessive penetration.

The use of the lower frequency in the upper inductor 24 substantially reduces the power consumption because it lowers the effective resistance of the melt as compared to the use of a higher frequency. A further benefit of using a lower frequency for the upper inductor 24 is to reduce the heat input to the melt. The lower inductor 25 because of its very high frequency provides a very high heat input to the melt. The upper inductor 24 operated at a lower frequency will put in a lower heat input per unit area of melt. This should ease the problem of temperature control in the overall system.

The lower frequency containment field of the upper inductor 24 will have a greater depth of penetration into the molten material sump 26 and will thereby provide improved stirring and better convective heat transfer from the narrow solidification zone 28 in which the molten material is solidifying during shaping and containment in the lower inductor 25. When casting materials such as silicon which have a relatively low thermal conductivity in the solid state and a conductivity approximating that of a metal in the molten state, grave difficulties are presented in providing sufficient cooling in the solidification zone 28. Therefore, the mixing or stirring effect of the applied electromagnetic field can be beneficial in creating a convective heat transfer from the narrow solidification zone 28 to the sump 26.

The use of a lower frequency for the applied current in the inductor 24 is helpful in providing improved stirring of the molten material. The lower the frequency the greater the depth of penetration of the current and, therefore, the greater the amount of material influenced by the magnetic field to provide the desired stirring action. Further, with an inductive type magnetic field as provided by the inductor 24 the convective movement is generally in a vertical sense rather than in a rotational sense about the axis of the casting. Therefore, the tendency would be for molten material adjacent the solidification zone to flow upwards toward the silicon addition bar and vice versa. Under the influence of the applied magnetic field if the penetration depth of the induced current is sufficiently great a large body of the molten material pool 26 will move under the influence of the magnetic field.

Assuming that the heat input of the lower inductor 25 is greater than the heat input of the upper inductor 24 this would provide a preferred cooling effect for the molten material in the solidification zone 28. This beneficial cooling effect of the convective flow due to electromagnetic stirring of the molten material will only occur in those instances where the molten material in the sump 26 is at a lower temperature than the molten material in the solidification zone 28. Irrespective of whether or not cooling improvements are obtained by the convective molten material flow the approach will clearly provide reduced temperature variations in the sump 26 and improved electrical efficiency by reducing the overall power requirements of the system.

The frequencies applied to the upper and lower inductors 24 and 25 have to be sufficient to provide a combined heat input to the overall system to maintain the molten material sump 26 and to enable the dissolution of the solid silicon addition bar 15 as it is advanced into the melt. Because of the very high frequencies used at the shaping lower inductor 25 a very substantial heat input should be provided by that inductor. Therefore, it may not be necessary to provide as much heat by means of the upper inductor 24. Further, it should be possible to use a current frequency for the upper inductor 24 which will add sufficient heat to provide the desired temperature for the molten material sump 26 but still be substantially lower in frequency than the lower inductor 25 current thereby providing the improved power efficiency. Further, if the gradient in temperature exists between the molten material sump 26 and the molten material in the solidification zone, the cooling benefits of the convective flow caused by the lower frequency upper inductor should also be provided.

Figures 2, 4:
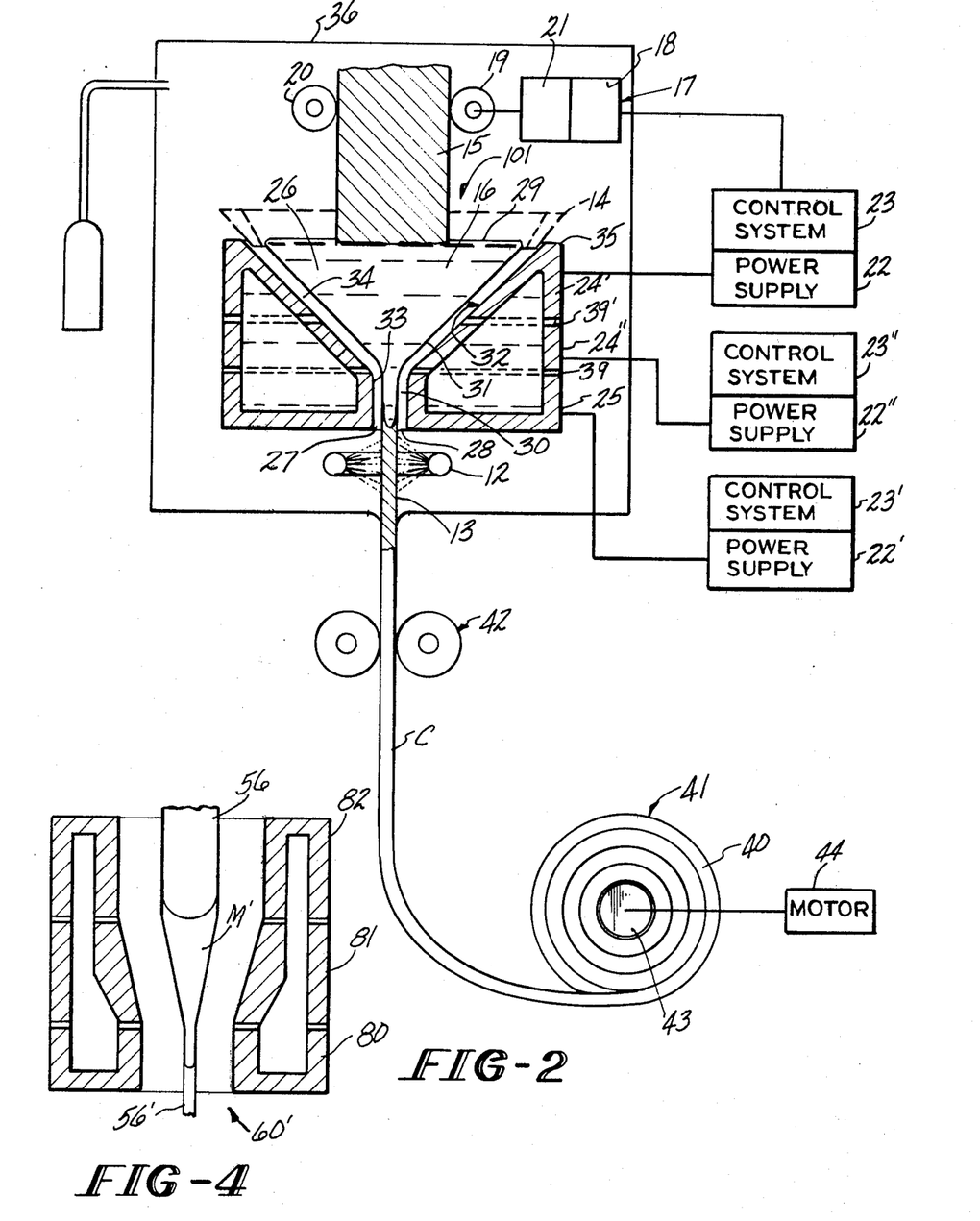
FIG. 2 is a schematic illustration of an alternative casting apparatus in accordance with this invention employing three inductors.
FIG. 4 is a schematic illustration of a three inductor system adapted for use with the apparatus of FIG. 3.

It is apparent from a consideration of the embodiment in FIG. 1 that the upper inductor 24 acts upon a very large transition in cross-sectional thickness of the molten material sump 26 from the region adjacent the solidification zone 28 to the top surface 29 of the molten material sump 26. Therefore, in accordance with a preferred aspect of the present invention as better illustrated in FIG. 2 it is possible to use more than the two inductors 24 and 25 described above. In fact, it is preferred in accordance with this embodiment of the invention to utilize at least three inductors 24', 24" and 25 although the use of more than three inductors is not intended to be excluded. In FIG. 2 like elements as described by reference to FIG. 1 have the same reference numerals.

In the three inductor design 10' the frequencies of the applied currents are reduced progressively between the lower inductor 25 and the middle inductor 24" and between that inductor and the upper inductor 24'. This is in conformity with the relative thickness increases in the molten material 16 being contained. The lower inductor 25 would be powered in a similar fashion to that described by reference to FIG. 1. The middle inductor 24" would have a substantially lower frequency than the lower inductor 25 and the upper inductor 24' would have a substantially lower frequency than the middle inductor 24". Therefore, the use of more than two inductors enables one to more closely tailor the applied frequencies to the relative thicknesses of the molten material being contained by the inductors and thereby to realize optimum power efficiency. This may be accomplished as shown in FIG. 2 through the use of three individual power supplies 22, 22' and 22" and control systems 23, 23' and 23" which function essentially in the same manner as those described with reference to FIG. 1. Alternatively, as in FIG. 1, progressive step-down frequency circuits could be utilized with a single power supply and control system for powering each of the respective lower frequency inductors. All other elements of the apparatus of FIG. 2 are essentially the same as that described by reference to FIG. 1 and, therefore, have been given similar reference numerals.

In the embodiment of FIG. 2 the lower inductor 24' would be powered in the megahertz range preferably at least one megahertz and most preferably at least 3 megahertz. The middle inductor 24" would be powered in a range of hundreds of kilohertz, preferably 100 kilohertz to about 800 kilohertz and most preferably 200 to 600 kilohertz. The upper inductor 24 would be powered in a range of preferably 1 kilohertz to about 50 kilohertz and most preferably 2 kilohertz to 10 kilohertz. In this manner it would be possible to tailor the penetration depth of the applied current to the cross-sectional thickness in a transverse plane of the molten material melt 26 seen by inductor 24, 24' or 24". The cross-sectional thickness as described above would comprise an average cross-sectional thickness opposed by the inductor 24, 24' or 24". This would provide even further improvement in the electrical efficiency of the overall system as compared to the embodiment of FIG. 1. If desired, of course, one could employ even more inductors and even more closely tailor the frequencies to the respective average transverse thicknesses of the melt.

It is apparent from FIG. 2 and the above description that in this embodiment the original upper inductor 24 as in FIG. 1 has been divided into the two inductors 24' and 24". These inductors are electrically isolated one from the other in the same manner as original inductors 24 and 25 were isolated. An insulating gasket 39' and insulating screws not shown secure the inductors 24' and 24" together. While a single cooling chamber is shown composed of all three inductors, if desired, each inductor could have its own separate cooling chamber.

Figure 3:
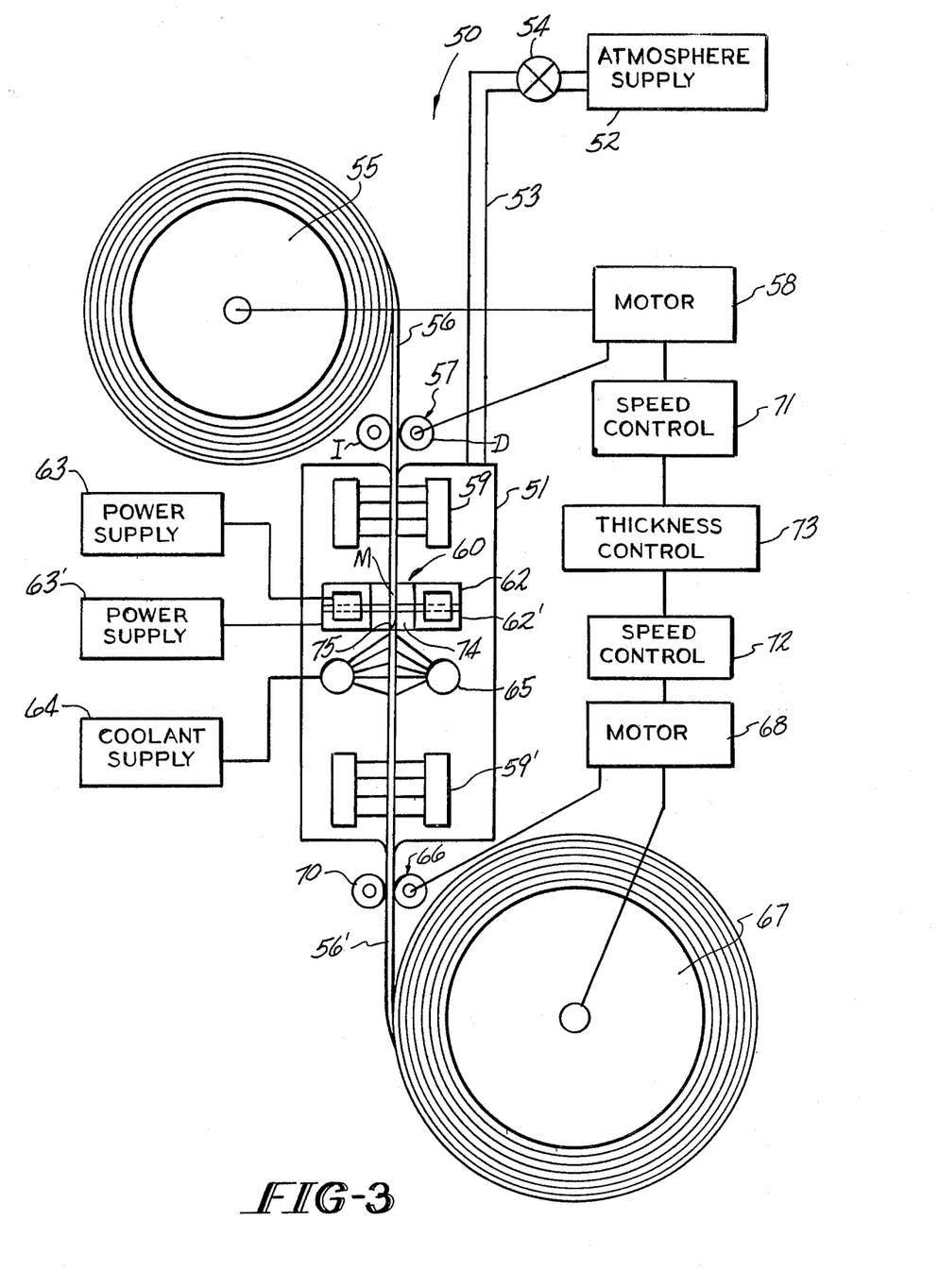
FIG. 3 is a schematic representation of a strip reforming apparatus in accordance with this invention employing two inductors.

The use of plural applied frequencies for a multiple inductor electromagnetic containment and forming system while finding preferred application in the embodiments as described by reference to FIGS. 1 and 2 can also find application in other related systems as, for example, that shown in FIG. 3. FIG. 3 relates to a strip reforming apparatus 50 in accordance with the Winter application. The apparatus of FIG. 3 will be described in greater detail hereinafter. However, in general the Winter apparatus is modified to provide a shaping and containment station 60 comprised of plural inductors 62 and 62' which are powered at different frequencies in accordance with this invention. In the Winter process a floating molten zone is passed through a starting strip of material to reform it into an improved strip of material which can have improved thickness uniformity and optionally either a thicker or thinner cross section. Where the cross section of the starting strip 56 and ending strip 56' are approximately the same, the present invention would offer less savings. Where, however, the process is operated to provide a thinner resulting strip 56', some savings may be achieved in accordance with the present invention by the use of multiple inductors and multiple frequencies as described above.

Referring now to FIG. 3, an apparatus 50 is shown which is adapted for carrying out the strip reforming process of the Winter application. The apparatus 50 shown includes an atmosphere controlled chamber 51 whereby it is possible to perform the process in a desired atmosphere which will reduce the possibility of contamination. A suitable atmosphere could comprise argon gas. However, any desired atmosphere could be utilized. The atmosphere is provided from a suitable atmosphere supply 52 which is connected to the processing chamber 51 by conduit 53 and valve 54. The atmosphere supply 52 can be of conventional design and does not form a part of the present invention.

The apparatus 50 includes a first payoff reel 55 of the starting strip material 56. A first capstan drive 57 is arranged adjacent the payoff reel 55 for controlling the rate of speed at which the starting strip material 56 is paid off the payoff reel 55. The capstan drive 57 is gear driven by motor 58 whose speed may be controlled in a manner which will be described later. The capstan drive 57 comprises opposed driven D and idling I pinch rolls. The payoff reel 55 is also gear driven by motor 58 through a slip clutch (not shown) at a relatively slower speed than the capstan drive 57 advances the strip 56 to thereby provide a slight tension on the strip 56 between the payoff reel 55 and the capstan drive 57. The strip 56 from the payoff coil is threaded through the nip of the capstan drive rolls 57 and then through a first guide means 59 which is adapted to guide the strip 56 into the processing station 60. The guide means 59 may be of any conventional design. It could comprise rollers, slides, or brushes as shown. The brushes are preferably formed of an inert material which will not contaminate the strip 56 and which is heat resistant. A suitable material would comprise fibers of polytetrafluroethylene.

The strip 56 is then forwarded through the electromagnetic containment and melting station 60 in accordance with the present invention. It is preferred in accordance with this invention that the electromagnetic containment and melting station comprise at least two inductors 62 and 62' which are powered by supplies 63 and 63' in a manner so as to both melt the incoming strip 56 to form the floating molten zone and also to contain and form the molten material into the desired strip cross section. While it is preferred to use inductors 62 and 62' for simultaneously forming and containing the molten material and for providing the necessary heat input to melt the incoming strip if desired, the melting operation could be provided by a separate heating source which could be another inductor or a laser or any other desired heat input system.

A suitable coolant from supply 64 is applied by spray manifold 12 to the resulting strip 56' after passing through the containment inductors 62 and 62'. The coolant may comprise any desired coolant material such as argon gas or water and it can be gaseous or liquid as desired. The use of an inert gas is suitable when the rate at which the strip 56' is advanced is relatively slow as might be the case for single crystal growth. The use of water is more suited to high speed travel of the strip.

The solidified strip is then passed through a second guide means 59' constructed of brushes in a manner similar to that of the first guide means 59.

A second capstan drive 66 is arranged adjacent the takeup reel 67 for controlling the rate of speed at which the resulting strip material 56' is paid off the payoff reel 55. The capstan drive 66 following the containment station 60 is gear driven by motor 68 whose speed may be controlled in a manner which will be described later. The capstan drive 66 also comprises opposed driven 69 and idling 70 pinch rolls. The strip 56' is threaded through the nip of the capstan drive rolls 66 and then onto the takeup reel 67. The takeup reel 67 is also gear driven by motor 68 through a slip clutch (not shown) at a relatively higher speed than the capstan drive 66 advances the strip 56' to thereby provide a slight tension on the strip 56' between the takeup reel 67 and the capstan drive 66.

For brittle materials, such as silicon, the reels 55 and 67 are relatively large in diameter so as not to exceed the flexibility of material. However, with thin strip materials to which this invention is principally applicable, it is possible to coil and uncoil even brittle materials on large diameter reels 55 and 67.

The thickness of the resulting strip 56' is a function of the rate at which the incoming strip 56 is fed to the melting and containment station 60 and the exiting solidifying strip 56' is withdrawn from that station 60. These rates are controlled by the aforenoted motors 58 and 68 and capstain drives whose speed is in turn controlled by a conventional speed control 71 or 72, respectively. The speed controls 71 or 72 are in turn actuated by a thickness control system 73. The thickness control system 73 can comprise a conventional switch bank arrangement wherein a plurality of selectable speed levels can be selected for each motor 58 or 68 through speed controls 72 or 72. By varying the ratio of the speed of the payoff capstan 57 versus the takeup capstan 66, it is possible to either maintain the thickness of the incoming strip 56 or to reduce the thickness of the strip 56 or if desired, even increase the thickness of the strip 56.

This invention is particularly adapted for use with the thinning mode of operation. If it is desired to thin the incoming strip 56 to provide a resulting strip 56' which is thinner, then the takeup capstan 66 would be driven so that the strip 56' leaving the containment zone 60 would exit at a speed greater than the speed of the incoming strip 56. In this manner, it is possible to control the thickness of the resulting strip 56' by controlling the relative speed at which the strip 56' is withdrawn from the containment station 60 as compared to the speed at which the strip 56 enters the containment station 60.

The thickness control system 73 accomplishes this by setting a desired operational speed for each of the motors 58 and 68. The thickness control system 73 can comprise any desired arrangement for selectively controlling the ratio of speeds of the motors 58 and 68 to provide the desired input and output speeds of the strips 56 and 56', respectively. Further, it is possible in accordance with this invention for the thickness control system 73 to utilize a computer which would automatically regulate the speed controls 71 and 72 to drive the motors 58 and 68 at the desired speeds for achieving a given thickness in the resultant product 56'.

The inductors 62 and 62' are independently excited by an alternating current from power supplies and control systems 63 and 63' which may be of any desired design. However, preferably it is in accordance with the teachings of U.S. Pat. No. 4,161,206 to Yarwood et al. In that approach current in the inductors 62 or 62' is controlled in a manner so as to maintain the inductance of the inductors 62 or 62' substantially constant. This insures a uniform air gap being maintained between the molten material 56 and the surrounding inductors 62 or 62' as a run proceeds.

The shaping and containment mechanism of the inductors 62 or 62' is the same as described by reference to the previous embodiments.

Further details of the operation of the apparatus 50 in general as described by reference to FIG. 3 can be obtained by reference to the Winter application. The inductors 62 and 62' are powered in a manner so as to preferably not only contain and support the molten material in the floating molten zone M but also so as to heat the material in the zone to a temperature at which the incoming strip 56 will melt as it is advanced into the melting and containment zone. This is accomplished by balancing the pressure and heat input provided by the inductors 62 and 62' in the same manner as described by reference to the embodiments of FIGS. 1 and 2.

The penetration depth of the current applied to the inductors 62 and 62' should similarly preferably be controlled in a manner as described by reference to the embodiment of FIGS. 1 and 2.

The floating molten zone M which is contained and shaped by the electromagnetic forces is capable of overcoming surface tension and gravity effects. Since the molten zone M progressively is relatively moved along the strip 56 in a given direction the molten zone M should increase the purity of the resultant strip 56' in accordance with conventional zone refining principle.

In accordance with this invention the frequencies particularly for a thinning mode of operation of the apparatus 50 described by reference to FIG. 3 are controlled in a manner similar to the manner in which the frequencies in the embodiment of FIG. 1 are controlled. Namely, the frequency of the current applied to the upper inductor 62 is substantially lower than the frequency applied to the lower inductor 62'. The lower inductor 62' would have an applied current whose frequency would be in the range of at least one megahertz and preferably a least 3 megahertz. The upper inductor 62 could be powered at a substantially lower frequency of from about 100 kilohertz to about 800 kilohertz and preferably from about 300 kilohertz to about 600 kilohertz.

Since the starting strip 56 material is relatively thin it is not possible for the upper inductor 62 to be operated at much lower frequencies without a loss of magnetic pressure due to excess penetration of the induced current. In accordance with this embodiment of the invention not as much power may be saved as compared to the embodiment of FIG. 1, however, some power savings should be achievable.

Further, just as in accordance with the embodiment of FIG. 2 and referring now to FIGS. 3 and 4, it is possible to utilize more than two inductors 62 and 62' in the shaping and containment station 60. FIG. 4 shows a three inductor 80, 81 and 82 shaping and containment station 61' which could be used in place of the two inductors system 62 and 62' shown in FIG. 3. A substantial thinning in cross section of the strip 57 is achieved by this arrangement. The molten zone M' has a funnel shape to account for the thinning action. The lower inductor 80 provides the shaping and containment to form the final strip 56' and is powered in the same manner as the lower inductor 62' in the embodiment of FIG. 3. The upper inductor 82 opposes the largest transverse thickness of molten material M' and, therefore, may be powered at a markedly lower frequency. The middle inductor opposes the major transition zone between the thicker strip 56 and the thinner strip 56' and this zone can be provided with a frequency adjusted to the average transverse thickness.

The middle inductor 81 would probably be powered in a manner similar to the arrangement for the inductor 62 in FIG. 3. The upper inductor 82, however, could be powered at a still lower frequency of from about 10 kilohertz to about 400 kilohertz and preferably from about 50 kilohertz to about 200 kilohertz.

While the invention has been described by reference to apparatuses in accordance with the patent applications of Pryor and Winter, it is applicable to a wide range of apparatuses which employ electromagnetic forces for containment and shaping of molten material. If desired, it could be employed with hybrid type apparatuses as described in British Pat. Nos. 1,481,301 and 1,499,809. Such hybrid apparatuses include a crucible for providing at least partial containment. The use of such hybrid apparatuses, however, is not desirable because of the potential contamination associated with the interaction of the molten material and the crucible itself.

The processes and apparatuses of the present invention are particularly adapted for forming strip materials of high dimensional uniformity; polycrystalline strip having a large structure preferredness; or single crystal strip.

While the invention has been described generally by reference to semiconductor materials, it may be adapted if desired for use with various metals including copper and copper alloys, steel and steel alloys, aluminum and aluminum alloys, nickel and nickel alloys although other metals and alloys are not intended to be excluded. While the invention has been described with respect to the treatment of metalloids such as silicon or germanium, it is applicable to a wide range of such semi-metals which find applications in semiconductor devices or solar cells including compound semiconductive materials such as galliumarsenide or the like. These materials are mentioned by way of example and it is not intended to exclude other metalloids or electronic semiconductive type materials finding application in electronic devices. Further, the materials may be doped or undoped as desired.

The patents, patent applications and texts set forth in this application are intended to be incorporated by reference herein.

It is apparent that there has been provided in accordance with this invention a process and apparatus for electromagnetically casting or reforming strip materials which fully satisfy the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. In a process for electromagnetically containing and forming molten material into a desired thin strip shape comprising the steps of providing at least two inductors for applying a magnetic field to said molten material wherein a first of said inductors elecromagnetically contains a first portion of said molten material and a second of said inductors electromagnetically contains and forms a second portion of said molten material into said thin strip shape at a solidification zone, powering said inductors to provide said magnetic field, and electromagnetically containing and forming said molten material, the improvement comprising: controlling the heat input to said first portion and said second portion of said molten material and stirring said molten material in said first portion so that the molten material in said first portion is at a lower temperature than the molten material in said second portion at said solidification zone, said heat input controlling and stirring steps comprising the step of powering said first inductor with an alternating current having a first frequency and powering said second inductor with an alternating current having a second frequency substantially higher than said first frequency, whereby beneficial cooling of the molten material at said solidification zone is provided by the molten material of said first portion and the overall power consumption of said process is reduced.

2. A process as in claim 1 wherein said first inductor is operative to form a sump of said molten material having at a top surface thereof a substantially larger cross-sectional area as compared to a cross-sectional area of said thin strip shape.

3. A process as in claim 2 wherein said first frequency comprises from about 1 kilohertz to about 500 kilohertz and wherein said second frequency comprises at least about 1 megahertz.

4. A process as in claim 2 wherein said electromagnetic containing and forming step comprises providing at least three inductors for applying said magnetic field to said molten material and wherein a third of said inductors is arranged intermediate said first and second inductors and wherein said step of powering said inductors further includes applying an alternating current having a third frequency to said third inductor, said third frequency having a value intermediate said first frequency and said second frequency.

5. A process as in claim 4 wherein said first frequency comprises from about 1 kilohertz to about 50 kilohertz and wherein said second frequency comprises at least about 1 megahertz and wherein said third frequency comprises from about 100 kilohertz to about 800 kilohertz.

6. A process as in claim 1 wherein said step of electromagnetically containing and forming said material in molten form into said desired thin strip shape comprises forming a floating molten zone of said material in a starting strip of said material and providing relative movement between said starting strip and said floating molten zone of said material.

7. A process as in claim 6 wherein said first frequency comprises from about 1 kilohertz to about 500 kilohertz and wherein said second frequency comprises at least about 1 megahertz.

8. A process as in claim 6 wherein said electromagnetic containing and forming step comprises providing at least three inductors for applying said magnetic field to said molten material and wherein a third of said inductors is arranged intermediate said first and second inductors and wherein said step of powering said inductors further includes applying an alternating current having a third frequency to said third inductor, said third frequency having a value intermediate said first frequency and said second frequency.

9. A process as in claim 8 wherein said first frequency comprises from about 10 kilohertz to about 400 kilohertz and wherein said second frequency comprises at least about 1 megahertz and wherein said third frequency comprises from about 100 kilohertz to about 800 kilohertz.

10. A process as in claim 1 wherein said material comprises electronic semiconductor material.

11. A process as in claim 10 wherein said material comprises silicon.

* * * * *